United States Patent [19]
Lin

[11] Patent Number: 6,030,753
[45] Date of Patent: Feb. 29, 2000

[54] MONOLAYER LONGITUDINAL BIAS AND SENSOR TRACKWIDTH DEFINITION FOR OVERLAID ANISOTROPIC AND GIANT MAGNETORESISTIVE HEADS

[75] Inventor: Tsann Lin, Saratoga, Calif.

[73] Assignee: International Business Machines Corporation, Armonk, N.Y.

[21] Appl. No.: 09/309,481

[22] Filed: May 10, 1999

Related U.S. Application Data

[62] Division of application No. 08/929,154, Sep. 11, 1997, Pat. No. 5,949,623.

[51] Int. Cl.[7] .................................................. G11B 5/127
[52] U.S. Cl. ...................... 430/314; 29/603.01; 430/313; 430/319
[58] Field of Search ..................... 430/311, 313, 430/319, 320; 29/603.01, 603.07; 360/113

[56] References Cited

U.S. PATENT DOCUMENTS

| | | | |
|---|---|---|---|
| 4,771,349 | 9/1988 | Tsang | 360/113 |
| 4,972,284 | 11/1990 | Smith et al. | 360/113 |
| 4,987,508 | 1/1991 | Smith | 360/113 |
| 5,001,586 | 3/1991 | Aboaf et al. | 360/113 |
| 5,436,778 | 7/1995 | Lin et al. | 360/113 |
| 5,442,507 | 8/1995 | Koga et al. | 360/113 |
| 5,469,317 | 11/1995 | Nagata et al. | 360/113 |
| 5,475,550 | 12/1995 | George | 360/113 |
| 5,483,402 | 1/1996 | Batra | 360/113 |
| 5,495,378 | 2/1996 | Bonyhard et al. | 360/113 |
| 5,515,221 | 5/1996 | Gill et al. | 360/113 |
| 5,532,892 | 7/1996 | Nix et al. | 360/113 |
| 5,633,771 | 5/1997 | Yoda et al. | 360/121 |
| 5,654,566 | 8/1997 | Johnson | 257/295 |
| 5,664,316 | 9/1997 | Chen et al. | 29/603.08 |

*Primary Examiner*—Sharon Gibson
*Assistant Examiner*—Jill N. Holloman
*Attorney, Agent, or Firm*—John H. Holcombe

[57] ABSTRACT

A magnetoresistive (MR) head and a method are disclosed providing a longitudinal bias layer and conductor leads at end regions of sensor elements to form a sensor region between the end regions. A uniform longitudinal bias thin film layer is deposited overlaying the entirety of the upper MR sensor, and a uniform conductor thin film layer is deposited overlaying the entirety of the longitudinal bias thin film layer. A photoresist process is conducted over the conductor thin film layer to develop a mask of the end regions and to expose a central region between the end regions. A reactive-ion-etching process completely etches the conductor thin film layer in the exposed central region to expose the longitudinal bias layer in the central region, the photoresist mask is removed, and an ion milling process of the exposed longitudinal bias layer at the central region reduces the bias layer from a "bias" critical thickness to a "null" critical thickness to free the MR sensor elements, thereby forming a defined sensor region of the underlying MR sensor elements at the exposed longitudinal bias layer at the central region.

30 Claims, 8 Drawing Sheets

Depositions of Sensor Films

Patterning for Trackwidth

Ion Milling for Removal of Overcoat in Tail Regions

Depositions of Bias and Leads Films

Photoresist Liftoff

Depositions of Sensor Films

Patterning for Trackwidth

Ion Milling for Removal of Sensor Films in Tail Regions

Depositions of Bias and Leads Films

Photoresist Liftoff

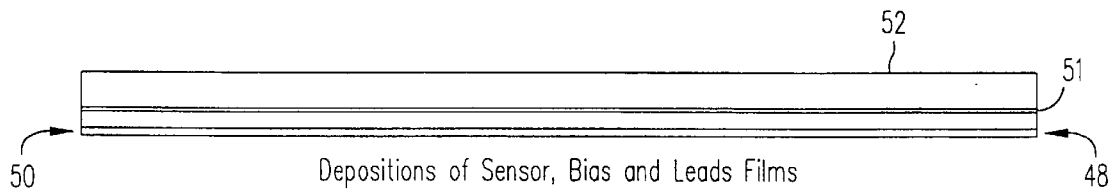
FIG. 5a Depositions of Sensor, Bias and Leads Films
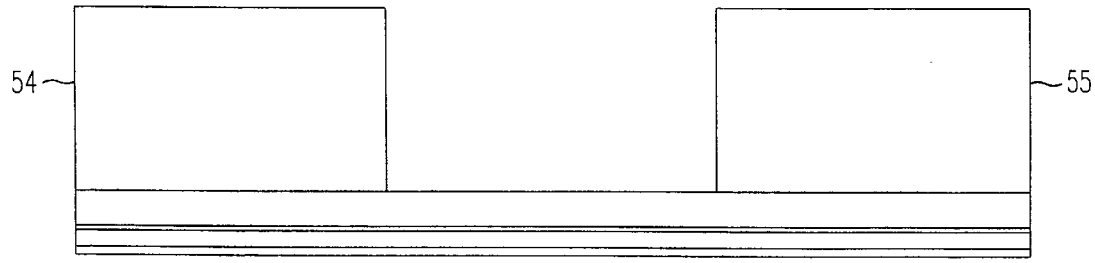
FIG. 5b Patterning for Trackwidth Definition
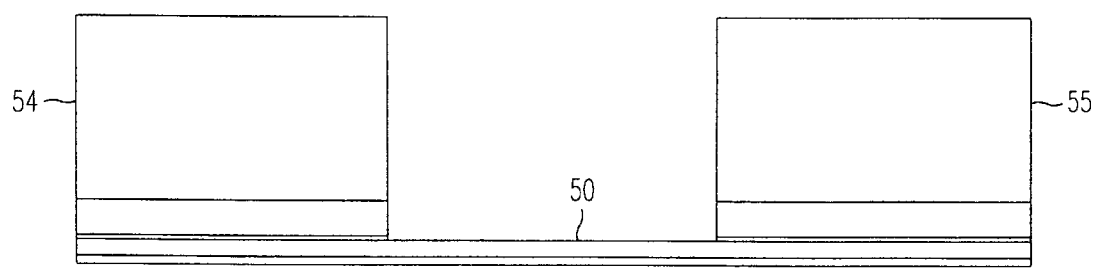
FIG. 5c Reactive Ion Milling for Removal of Leads Films in Read
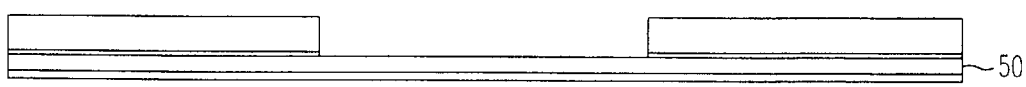
FIG. 5d Photoresist Liftoff
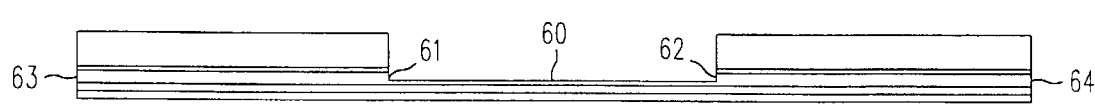
FIG. 5e Ion Milling for Partial Removal of Bias Films in Read Region

MONOLAYER LONGITUDINAL BIAS AND SENSOR TRACKWIDTH DEFINITION FOR OVERLAID ANISOTROPIC AND GIANT MAGNETORESISTIVE HEADS

This is a Divisional application of Ser. No. 08/929,154, now U.S. Pat. No. 5,949,623, filed Sep. 11, 1997.

TECHNICAL FIELD

This invention relates to thin film magnetoresistive heads, and more particularly, to a longitudinal bias layer for overlaid anisotropic and giant magnetoresistive read transducers to provide sensor active region trackwidth definition, and a method for making anisotropic and giant magnetoresistive read transducers with an overlaid longitudinal bias layer providing sensor active region trackwidth definition.

BACKGROUND OF THE INVENTION

Magnetoresistive (MR) read transducers are employed extensively for reading magnetically recorded data, typically recorded in parallel tracks on magnetic disk or on magnetic tape. A key dimension for MR transducers is the width of the active sense region, which defines the trackwidth of the recorded data that is read. If the active sense region width is narrower and more precisely defined, the data tracks of recorded data may be narrower and closer together, thereby allowing more tracks on the same dimensioned recording media and thereby increasing the data capacity of the recording media.

Anistropic magnetoresistive (AMR) heads are one type of magnetoresistive head and include an AMR sensor contacted by longitudinal bias and conductor leads films. Typically, the AMR sensor and bias and conductor films are sandwiched between inductive write films, or between an inductive write film and a shield.

The AMR sensor typically includes a ferromagnetic sense layer separated by a nonmagnetic spacer layer from a ferromagnetic reference layer. The reference layer generates a transverse bias reference field, either by activation from the current supplied to the sensor for sensing the resistance of the sense layer, or by being pinned in a transverse direction through exchange coupling between the reference layer and an underlying ferromagnetic pinning layer. The transverse bias is conventionally used to maintain the sensor in its most linear operating range.

Longitudinal bias is conventionally required to reduce Barkhausen noise for the stabilization of MR sensors. Two major types of longitudinal bias are currently utilized, the overlaid longitudinal bias wherein separate longitudinal bias layers overlay the sense layer in each of the end regions, and the abutting longitudinal bias wherein the sense layer is only in the center region and the bias layers abut and are adjacent the sense layer in the end regions.

Another magnetoresistive head gaining in usage is the giant magnetoresistive sensor (GMR) which employs pinned and free ferromagnetic layers separated by a thin film layer of nonmagnetic material. The voltage across the GMR sensor is related to the rotation of the magnetization in the free ferromagnetic layer as a function of the magnetic field being sensed. Although the mechanism for sensing the magnetic field of the data being sensed is different from the magnetoresistive effect of the AMR sensor, the GMR sensor must also be stabilized by a longitudinal bias field. Typically, the GMR sensor is stabilized by overlaid longitudinal bias layers at each end of the sensor, although abutting longitudinal bias is also employed.

The longitudinal bias layers are conventionally overlaid with conductors which comprise the conductor leads at each end of the sensor. A current is supplied between the conductors which is conducted by the longitudinal bias layers to each end of the sense layer(s) and the voltage generated by the current across a central region of the sense layer(s) between the bias layers is the sense signal representative of the sensed recorded data. Thus, the active width of sense layer is defined by the central region between the longitudinal bias layers at each end of the sense layer central region.

Theoretical drawings of MR heads indicate that the edges of the longitudinal bias layers and the leads are perfectly aligned and perfectly vertical, either in the overlaid longitudinal bias or the abutting longitudinal bias. Conventional manufacturing produces edges that are less than perfectly aligned and less than perfectly vertical. In a mass production environment, the design of the disk file must accommodate the various active areas of MR read transducers. Therefore, the more difficult it is to align the edges, the more difficult it is to define the width of the active sense region, and the parallel tracks of recorded data must be located further apart to accommodate the various widths of the active sense region of the manufactured transducers.

FIG. 1 illustrates a conventional overlaid MR transducer, which may either be an anisotropic MR transducer or a giant MR transducer, with overlaid longitudinal bias layers in the end regions. A plurality of sensor layers 10 are provided. In an anisotropic MR transducer, the sensor layers 10 may include a pinning layer and a soft adjacent layer (SAL) which together provide the transverse bias, a spacer layer, and the sense layer. In a giant MR transducer, the sensor layers 10 may include a pinning layer and a ferromagnetic layer fixed by the pinning layer, a nonmagnetic spacer, and the free ferromagnetic layer. A separate overcoat layer 11 is provided to protect the sensor 10.

Longitudinal bias layers 12 and 13 and conductor lead layers 14 and 15 overlie the sensor layers 10 in the end regions. Typically, the longitudinal bias layers are exchange-coupled ferromagnetic/antiferromagnetic films. As can be seen from the illustration, the longitudinal bias layers 12 and 13 and the conductor lead layers 14 and 15 of the conventional overlaid MR transducer are at a low angle and do not provide easily aligned and vertical edges to define an active central region of the sensor layers 10.

FIG. 2 illustrates a conventional abutted MR transducer, which may either be an anisotropic MR transducer or a giant MR transducer, with the sensor layers 20 abutted by longitudinal bias layers 21 and 22 in the end regions. Conductor lead layers 23 and 24 overlie the longitudinal bias layers 21 and 22 in the end regions. Again, the conductor lead layers 23 and 24 of the conventional abutted MR transducer are at a low angle and do not provide easily aligned and vertical edges to define an active central region of the sensor layers 20.

The reason that the conventional MR transducers do not provide easily aligned and vertical edges to the longitudinal bias and conductor lead layers is a result of the conventional manufacturing processes illustrated in FIGS. 3a–e and 4a–e.

FIGS. 3a–e illustrate the conventional manufacturing process for an overlaid MR transducer. In step 3a, the pinning, reference (either transverse bias or pinned layer), spacer, sense and overcoat films 10 are sequentially deposited on the bottom gap layer over an entire substrate wafer. In step 3b, after the depositions of step 3a, bilayer photoresists 30 and 31 are applied over the protective overcoat 32 and exposed in a photolithographic tool to mask the MR sensor in the active read region, and then developed in a solvent to form an undercut 33. The undercut 33 is provided to allow subsequent liftoff of the photoresist. In step 3c, the protective overcoat 32 in the unmasked end (or tail) regions is removed by ion milling to expose the top layer of the MR sensor. In step 3d, longitudinal bias films 12 and 13 and conductor leads 14 and 15 are deposited on top of the MR sensor. Longitudinal bias film material 36 and conductor lead material 37 is also deposited on the photoresist 31. The shadowing of the MR sensor by the photoresist 31 does not provide a vertical, aligned edge of the longitudinal bias films 12 and 13, and conductor leads 14 and 15, but, rather, provides a gradual slope of the longitudinal bias films and the conductor leads toward the central area of the sensor. Hence, the term "tail" is often used for the end region. The gradual angle of the slope makes the precise alignment of the edge difficult, thereby making a precise definition of the active sense region equally difficult. After the depositions, the photoresists are lifted off in step 3e.

FIGS. 4a–e illustrate the conventional manufacturing process for an abutted MR transducer. In step 4a, the pinning, reference (either transverse bias or pinned layer), spacer, sense and overcoat films 20 are sequentially deposited on the bottom gap layer over an entire substrate wafer. In step 4b, after the depositions of step 4a, bilayer photoresists 40 and 41 are applied over the protective overcoat 42 and exposed in a photolithographic tool to mask the MR sensor in the active read region, and then developed in a solvent to form an undercut 43. The undercut 43 is provided to allow subsequent liftoff of the photoresist. In step 4c, the reference, spacer, sense and overcoat films in the unmasked end (or tail) regions is removed by ion milling, leaving the sensor 20. In step 4d, longitudinal bias films 21 and 22 and conductor leads 23 and 24 are deposited at the end regions, abutting the MR sensor. Longitudinal bias film material 46 and conductor lead material 47 is also deposited on the photoresist 41. The shadowing of the MR sensor by the photoresist 41 does not provide a vertical, aligned edge of the sensor 20 as the result of the ion milling. Rather, the edge forms a "tail" or slope. The shadowing by the photoresist 41 during deposition of the longitudinal bias films 21 and 22, and conductor leads 23 and 24, does not provide an aligned edge of the deposited films, but, rather, provides a gradual slope of the longitudinal bias films and the conductor leads toward the central area of the sensor. The various slopes make the precise alignment of the edges difficult, thereby making a precise definition of the active sense region equally difficult. After the depositions, the photoresists are lifted off in step 4e.

As discussed above, the trackwidth is typically defined by the edge boundary between the MR sensor and bias/leads layers. This trackwidth definition is difficult mainly due to the use of the bilayer photoresist for the ease of photoresist liftoff.

As shown in FIGS. 3d and 4d, the longitudinal bias and conductor leads films penetrate imprecisely into the undercut regions. The extent of this penetration depends on sputtering modes (RF diode, RF magnetron, DC magnetron and ion beam), shadowing effects of the bilayer photoresists, and overhangs of bias/leads films deposited on the sidewalls of the top photoresist. Thus, trackwidth is difficult to determine from the dimension of the top or bottom photoresist. In addition, the shadowing effects of the photoresists also lead to substantial reduction in the thicknesses of bias/leads films at the sensor edges, and difficulties in achieving magnetic moment balance between the read and tail (or end) regions. This moment balance is crucial in stabilizing the MR sensor without reduction in read sensitivity.

SUMMARY OF THE INVENTION

It is therefore an object of the present invention to provide an overlaid MR head with more precisely aligned edges between the sense region of the central region and the longitudinal bias and conductor leads at the end (or tail) regions of the sensor.

A method is disclosed for fabricating a longitudinal bias layer and conductor leads at end regions of magnetoresistive (MR) sensor elements to form a sensor region between the end regions, comprising the steps of:

depositing a uniform longitudinal bias thin film layer overlaying the entirety of the upper MR sensor;

depositing a uniform conductor thin film layer overlaying the entirety of the longitudinal bias thin film layer;

conducting an entire photoresist process over the conductor thin film layer to develop a mask of the end regions and to expose a central region between the end regions;

conducting a reactive-ion-etching process to completely etch the conductor thin film layer in the exposed central region to expose the longitudinal bias layer in the central region between the end regions;

removing the photoresist mask; and conducting an ion milling process of at least the exposed longitudinal bias layer at the central region to a thickness thereof which is less than a "null" critical thickness to free the MR sensor elements, thereby forming a defined sensor region of the underlying MR sensor elements at the exposed longitudinal bias layer at the central region.

An MR sensor is also disclosed having a plurality of thin film layers providing an MR sensor layer, and a thin film monolayer of magnetic bias material having end regions and a central region between the end regions, the end regions having a thickness greater than a "bias" critical thickness to comprise a bias layer, to establish a longitudinal bias of the MR sensor layer, and the central region having a thickness less than the "null" critical thickness to define the active read region of the sensor.

The sensor and the method may be employed for overlaid anisotropic or giant MR sensors and are primarily for reading data recorded on magnetic disk(s) of magnetic disk drives. The disk drives are designed with narrow, closely spaced tracks as allowed by the defined active read region of the sensor. The reading of data recorded on magnetic tape and flexible disk may also be accomplished with the disclosed overlaid MR sensors.

For a fuller understanding of the present invention, reference should be made to the following detailed description taken in conjunction with the accompanying drawings.

BRIEF DESCRIPTION OF THE DRAWINGS

FIGS. 5a–e are a series of illustrations of steps of a method in accordance with the present invention for manufacturing an overlaid MR head;

DETAILED DESCRIPTION OF THE INVENTION

Figure 1:
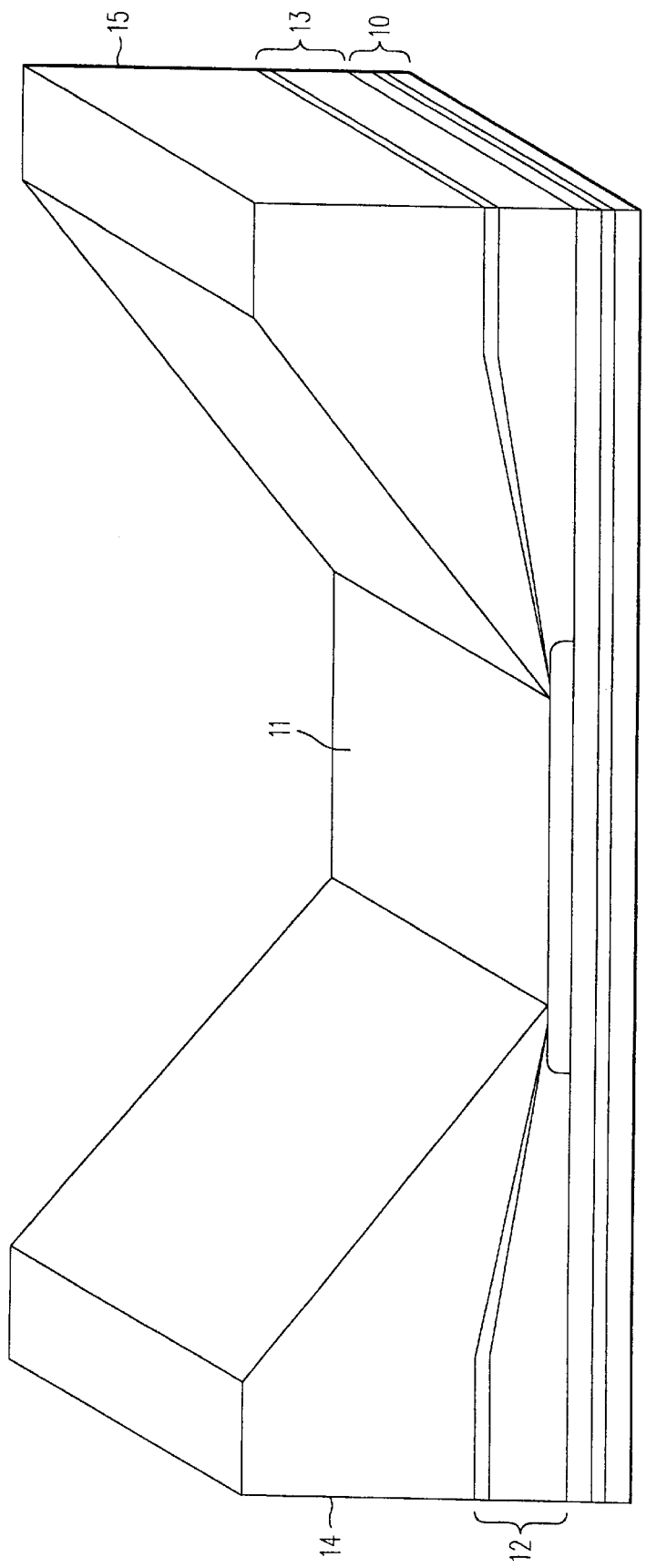
FIG. 1 is a perspective illustration of an overlaid MR head of the prior art.
Figure 2:
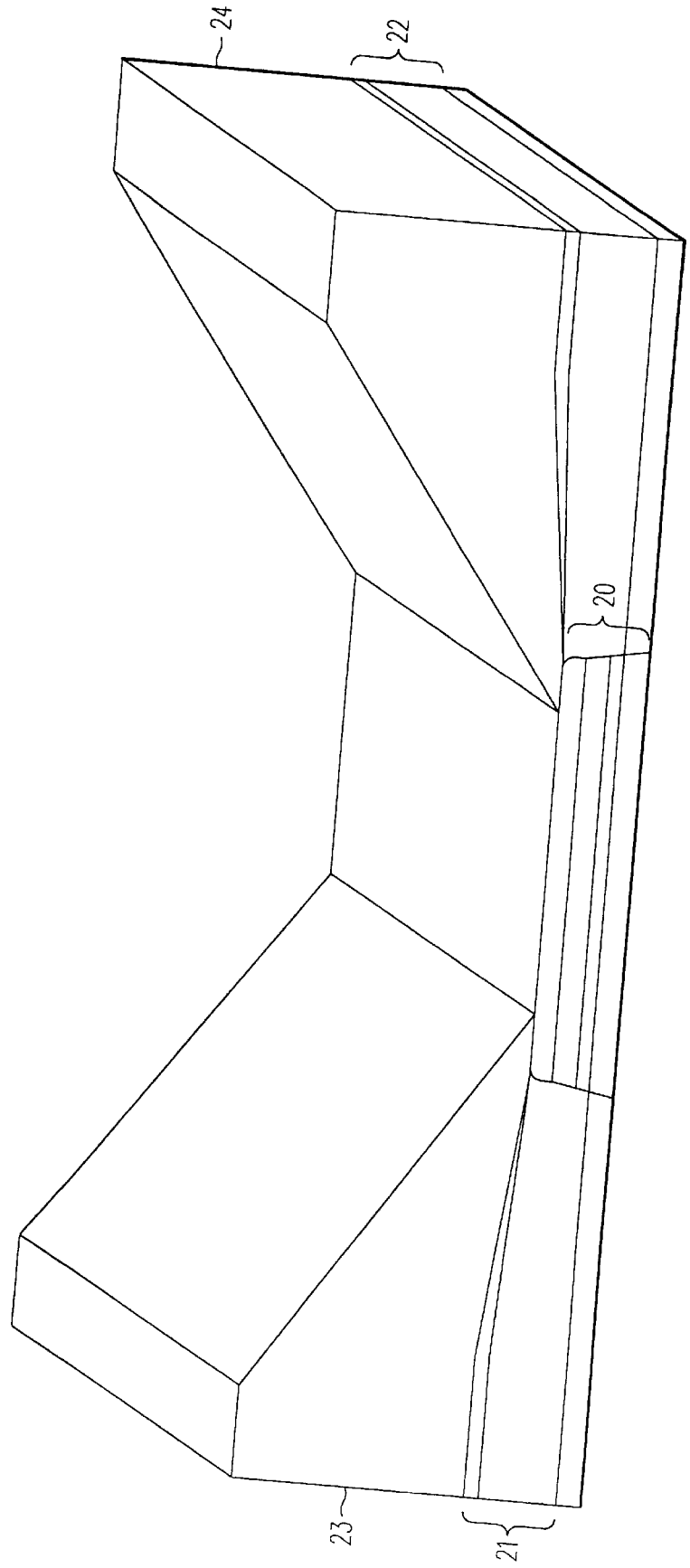
FIG. 2 is a perspective illustration of an abutted MR head of the prior art.
Figure 3A:
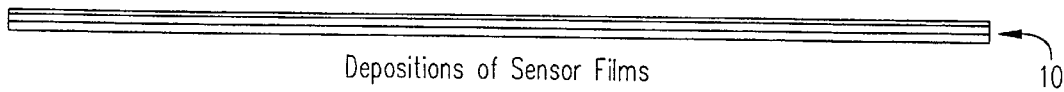
FIGS. 3a–e are a series of illustrations of steps of the prior art method for manufacturing an overlaid MR head of FIG. 1.
Figure 3B:
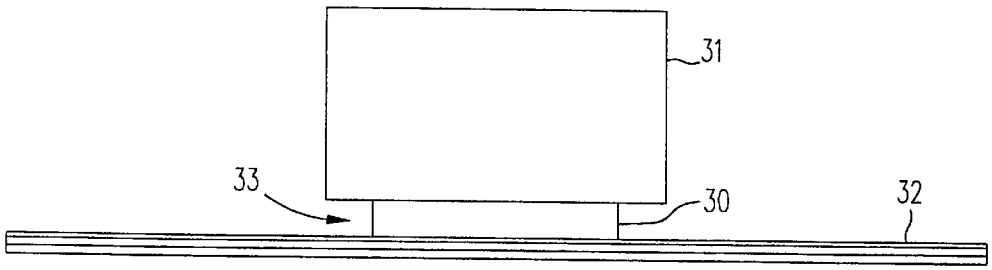
Figure 3C:
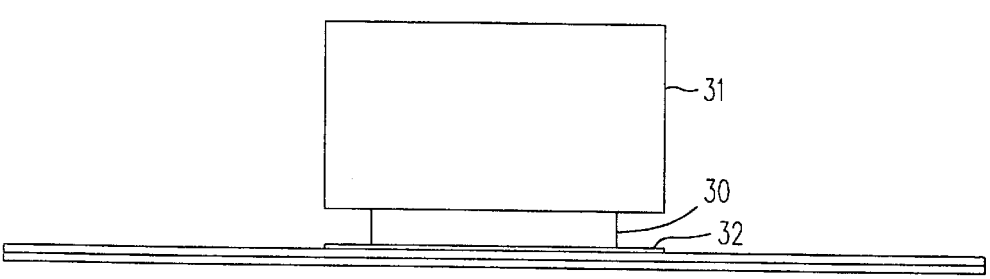
Figure 3D:
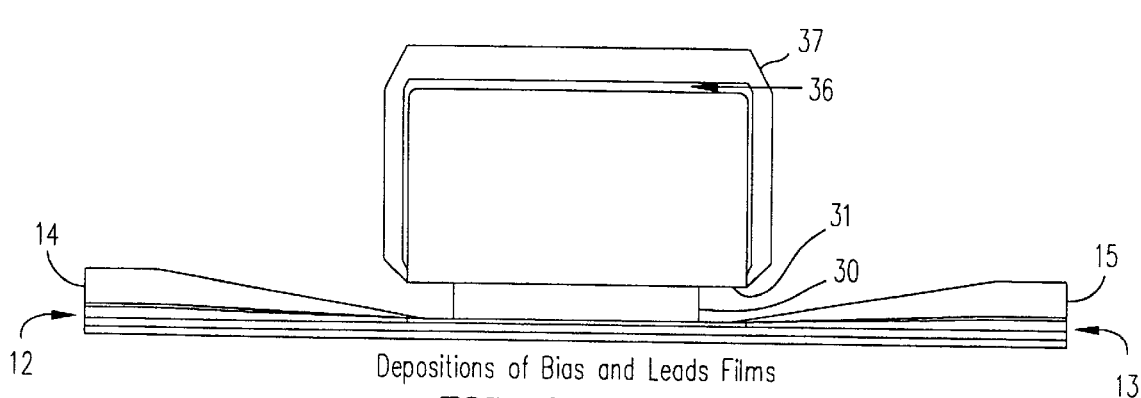
Figure 3E:
Figure 4A:
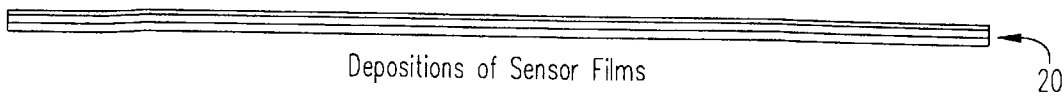
FIGS. 4a–e are a series of illustrations of steps of the prior art method for manufacturing an abutted MR head of FIG. 2.
Figure 4B:
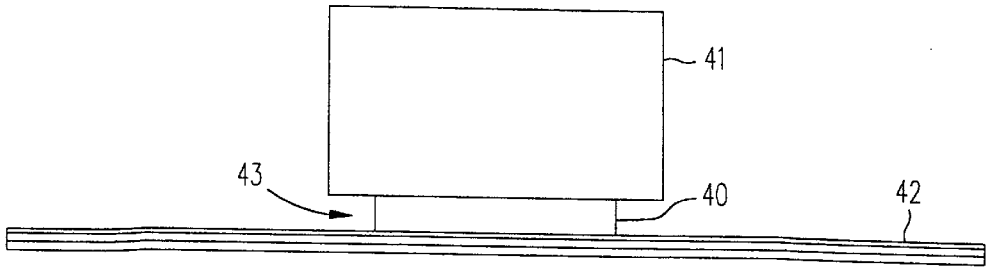
Figure 4C:
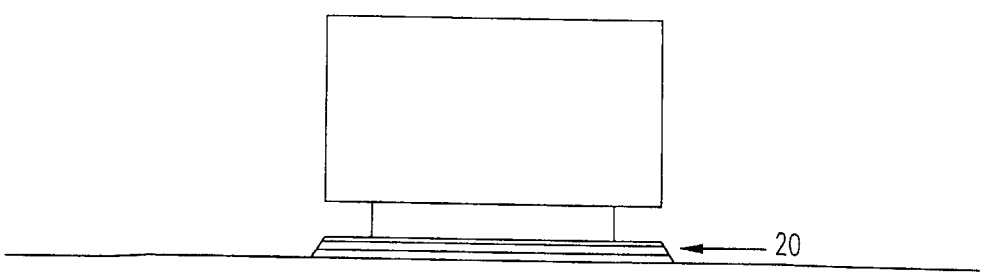
Figure 4D:
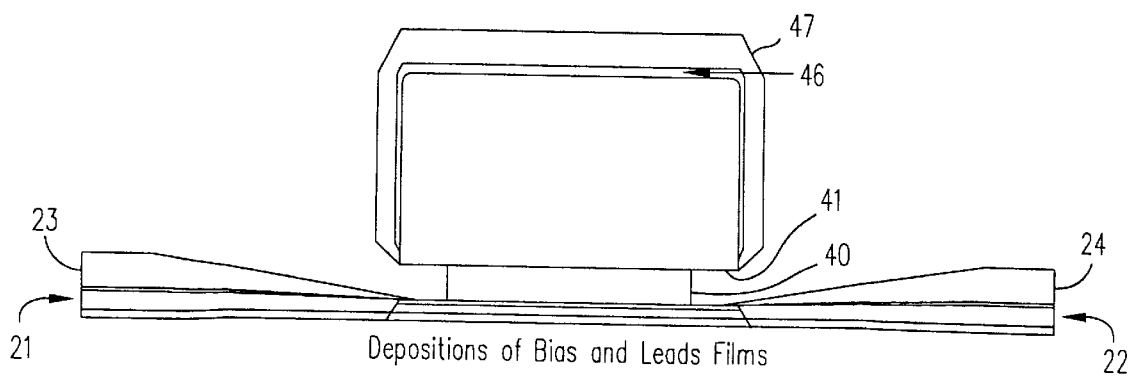
Figure 4E:

Diagrams of profiles of an overlaid MR transducer during the fabrication process of the present invention are shown in FIGS. 5a–e. An overlaid MR transducer has the MR sense layer(s) extend across the central and end regions, with longitudinal bias layers and conductors overlaying the sense layer(s) in the end regions. The MR transducer may be an anisotropic MR transducer, or a giant MR transducer. In step 5a, the pinning (if needed), reference (the SAL in AMR and the pinned layer in GMR), spacer and sense layers 48 comprising the MR sensor are first deposited in the conventional manner. Table 1 lists thin-film materials commonly used in both the AMR and GMR sensors.

TABLE 1

Thin-film materials used in AMR and GMR sensors

| Layer | AMR Sensor | GMR Sensor |
| --- | --- | --- |
| Pinning | NiO; Ni—Mn; Fe—Mn | NiO; Ni—Mn; Fe—Mn |
| Reference | Ni—Fe—Nb; Ni—Fe—Cr | Co; Ni—Fe/Co; Co/Ru/Co |
| Spacer | Ta; Al$_2$O$_3$ | Cu |
| Sense | Ni—Fe | Ni—Fe; Co/Ni—Fe |

Then, in accordance with the invention, a longitudinal bias layer 50 is deposited to overlay the entirety of the sensor layers 48. In one embodiment, the longitudinal bias layer 50 may comprise a single layer of Ni—Mn, as will be explained.

An underlayer 51 and conductor layer 52, preferably conductive Ta, are then sequentially deposited over the entirety of the longitudinal bias layer 50. The underlayer 51 is needed, preferably Ti—W, for the formation of a low resistivity alpha phase in the Ta film. Hereinafter, the "conductor layer" or "leads" refers to the combined layers 51 and 52.

In the one embodiment, subsequent to the depositions, and still in step 5a, the entire wafer is annealed in the presence of longitudinal fields in a vacuum oven. After annealing, exchange coupling occurs between the Ni—Fe film, which is the top layer of the MR sensor, and the Ni—Mn longitudinal bias layer 50, producing a unidirectional anisotropy field (H$_{UA}$).

Figure 6:
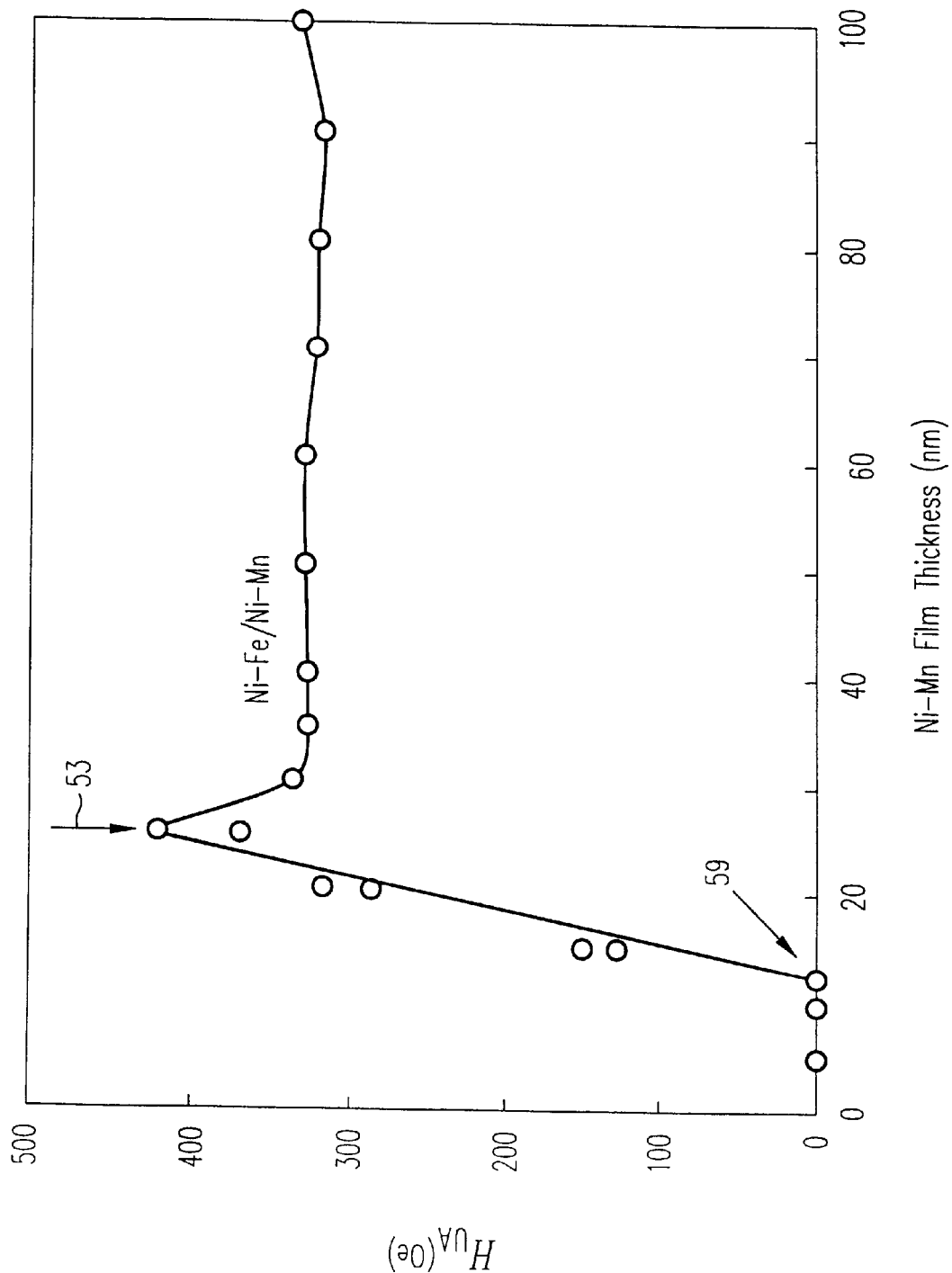
FIG. 6 is a graph of $H_{UA}$ vs. Ni—Mn film thickness for exemplary annealed Ni—Fe/Ni—Mn films.

FIG. 6 illustrates the relationship between H$_{UA}$ and the thickness of the Ni—Mn longitudinal layer for Ni—Fe(9 nm)/Ni—Mn films annealed for 10 hours at 255 degrees C. The annealing is crucial to exhibit strong exchange coupling between the Ni—Fe and Ni—Mn films. Those of skill in the art call the point at which the thickness is great enough that H$_{UA}$ reaches a maximum, the "critical" thickness 53. This "critical" thickness 53 is the minimum thickness of the Ni—Mn film required to establish the longitudinal bias. Hereinafter, the longitudinal bias "critical" thickness will be called the "bias critical" thickness.

In step 5b, a photoresist is applied and exposed in a photolithographic tool to provide masks 54 and 55 for the films in the end (or tail) regions. Preferably, the photoresist is a monolayer for better trackwidth control. The photoresist process may include spinning the photoresist monolayer over the conductor layers, then baking the photoresist layer. A photolithographic tool exposes the photoresist at the central region to be defined, and the photoresist is developed to remove the exposed resist material to provide the masks 54 and 55 for the films in the end regions.

In step 5c, the conductor leads in the unmasked regions are removed by reactive ion etching (RIE), with the non-RIEable bias film 50 as an RIE stopper. Only refractory metallic films, such as Ta, Ti, W, can be RIE'd in a fluorine-containing plasma. Thus, the Ni—Mn longitudinal bias monolayer 50 is difficult to RIE and serves as an RIE stop.

In step 5d, the photoresist is removed. The removal is easy because the photoresist masks 54 and 55 are exposed on all four sides.

In step 5e, ion milling is applied over the entire wafer to reduce the thickness of the bias film 50 in the read region 60 to below a critical value. The critical thickness is that thickness at which the longitudinal bias field substantially decreases to zero, leaving the sensor layer in the central region read area 60 free to rotate in the giant MR sensor or responsive to the sensed magnetic field of the recorded data in the anisotropic sensor.

In FIG. 6, the H$_{UA}$ gradually drops from the "bias critical" thickness 53 to a thickness 59 at which the H$_{UA}$ is essentially "zero". Hereinafter, the thickness 59 at which the H$_{UA}$ is essentially "zero" or "null" will be called a "null critical thickness", and is the point below which essentially no exchange coupling occurs. Many materials exhibit a very steep slope, or step function, making the "bias critical thickness" 53 essentially the same thickness as the "null critical thickness" 59. In the example of FIG. 6, the "null critical thickness" 59 of the Ni—Mn to which the Ni—Mn layer is to be reduced is 10 nm or less. A thickness of 5 nm is preferred.

Since the Ni—Mn film has a resistivity (175 micro ohm-cm), this thin film serves as a high resistivity overcoat in the read region, so that the current flow in the overcoat is limited.

The central active region 60 is therefore precisely defined by the aligned edges 61 and 62 of the end regions 63 and 64 of the longitudinal bias layers.

The fabrication method of the present invention provides several advantages. First, by eliminating bilayer photoresist liftoff, a trackwidth may be defined which is as narrow as the state-of-the-art technology of the semiconductor industry can achieve. Second, the MR film is well protected by the bias film during processing, as compared to exposure of the MR film to air and various chemical environments in the conventional process. Third, the magnetic moments of the MR films in read and end regions always remain identical, thereby maintaining the magnetic moment balance between the read and end regions.

Figure 7:
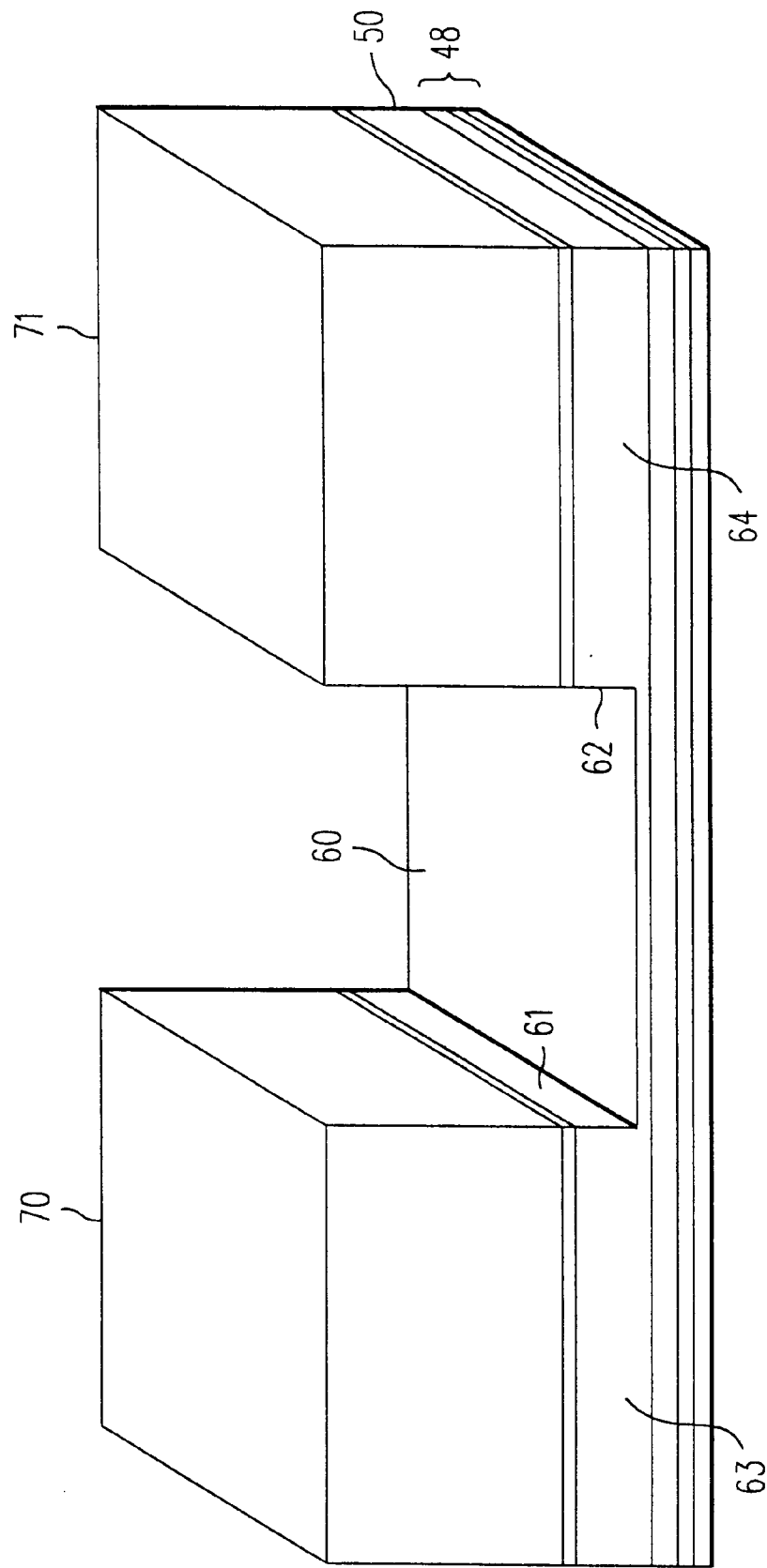
FIG. 7 is a perspective illustration of an overlaid MR head of the present invention.

FIG. 7 illustrates the overlaid MR transducer of the present invention, expanded in the vertical dimension for illustration. The transducer has a plurality of giant MR or anisotropic MR sense layers 48.

Overlaying the sense layers 48 is a layer of ferromagnetic material 50 which is greater than the bias critical thickness required to maintain the longitudinal bias field in only the end regions 63 and 64, and is thinner than the null critical thickness in the central region 60. Again, the null critical thickness is that thickness below which the longitudinal bias field is substantially zero, leaving the sensor layer in the central region read area 60 free to rotate in the giant MR sensor or responsive to the sensed magnetic field of the recorded data in the anisotropic sensor. The central region 60 is therefore precisely defined by the aligned edges 61 and 62 of the end regions 63 and 64 of the longitudinal bias layers.

Separate conductor layers 70 and 71 overlay each of the end regions 63 and 64, respectively, of the longitudinal bias layer. Each of the conductors 70 and 71 is a lead to provide the MR sense current to the sensor and the MR sense signal to the read circuitry of an associated drive.

In a specific example of a giant MR sensor, a sequence of films (thickness in nm): NiO(40)/Ni—Fe(2)/Co(1)/Cu(2)/Ni—Fe(8)/Ni—Mn($\geq$25)/Ti—W(5)/Ta($\geq$90), are sequentially deposited over an entire wafer or layout for the head, in step 5a, which may have a bottom ferromagnetic shield layer and a bottom gap layer. The layers are annealed for 10 hours at 255 degrees C. with the presence of longitudinal magnetic fields in a vacuum oven. After annealing, exchange coupling occurs between the Ni—Fe and Ni—Mn films, producing a unidirectional anisotropy field ($H_{UA}$) beyond 300 Oe and an easy-axis coercivity ($H_{CE}$) beyond 200 Oe.

A photoresist, which is preferably a monolayer photoresist for better definition, is then applied and exposed in a photolithographic tool to mask the films in the end regions in step 5b. The Ti—W/Ta films in the unmasked read regions are removed in step 5c by reactive ion etch. Since the Ni—Mn film is not RIEable, it serves as an etch stopper for the protection of the MR film. The photoresist is then removed in step 5d and an ion mill is applied in step 5e over the entire wafer to reduce the thickness of the Ni—Mn film in the read region from its bias critical thickness (25 nm) to below its null critical thickness of 10 nm. A preferred thickness is 5 nm. When the Ni—Mn film is thinner than its null critical thickness of 10 nm, $H_{UA}$ decreases to substantially zero and $H_{CE}$ decreases to the intrinsic value of the Ni—Fe film (1.2 Oe).

The ion milling also reduces the Ta film thickness in the tail (or end) regions by about 15 nm. Thus, the initial Ta film is required with a thickness 15 nm greater than the designed final value.

As a result of the ion milling, the Ni—Fe film in the read region is free for magnetization rotation, while the Ni—Fe film in the tail regions is pinned for sensor stabilization. After head fabrication, annealing for 20 minutes at 200 degree C. in the presence of a transverse field is performed to thermally set the NiO/Ni—Fe/Co films in the transverse direction. This low temperature annealing will not reorient the magnetizations of the Ni—Fe/Ni—Mn films in the end regions from the longitudinal direction.

In a specific example of an anisotropic MR sensor, a sequence of films (thickness in nm): Ni—Fe—Nb(5.5)/Ta(4.5)/Ni—Fe(9)/Ni—Mn($\geq$25)/Ti—W(5)/Ta($\geq$90), are sequentially deposited over an entire wafer or layout for the head, in step 5a, which may have a bottom ferromagnetic shield layer and a bottom gap layer. The layers are annealed for 10 hours at 255 degrees C. with the presence of longitudinal magnetic fields in a vacuum oven. After annealing, exchange coupling occurs between Ni—Fe and Ni—Mn films, producing a unidirectional anistropy field ($H_{UA}$) beyond 300 Oe and an easy-axis coercivity ($H_{CE}$) beyond 200 Oe.

A photoresist, preferably a monolayer photoresist, is then applied and exposed in a photolithographic tool to mask the films in the end regions in step 5b. The Ti—W/Ta films in the unmasked read regions are removed in step 5c by reactive ion etch. Since the Ni—Mn film is not RIEable, it serves as an etch stopper for the protection of the MR film. The photoresist is then removed in step 5d and an ion mill is applied in step 5e over the entire wafer to reduce the thickness of the Ni—Mn film in the read region from its bias critical thickness (25 nm) to below its null critical thickness of 10 nm. Again, the ion milling reduces the Ta film by about 15 nm, requiring that the initial thickness of the Ta film be 15 nm greater than the final design thickness.

As a result of the ion milling, the Ni—Fe film in the read region is free for magnetization rotation, while the Ni—Fe film in the tail regions is pinned for sensor stabilization.

As an alternative example, the transverse bias of the AMR sensor may be made by pinning the SAL with an underlying 40 nm layer of NiO, requiring the second low temperature annealing step described with respect to the exemplary GMR transducer.

As an alternative to both the GMR and AMR processes, to prevent the Ta consumption during ion milling, the ion milling step 5e can be applied before the photoresist removal of step 5d.

Alternatively, an $SiO_2$ film may be deposited after the depositions of the films in step 5a. This layer is reactive ion etched in step 5c in the read region and remains in the tail region for the protection of the Ta film during ion milling.

Once the MR sensor has been fabricated, an $Al_2O_3$ read gap layer is deposited over the entire wafer. In the instance where the $SiO_2$ film has been deposited, the dual $SiO_2/Al_2O_3$ gap ensures better insulation between the bias/leads films and a top shield.

Figure 8:
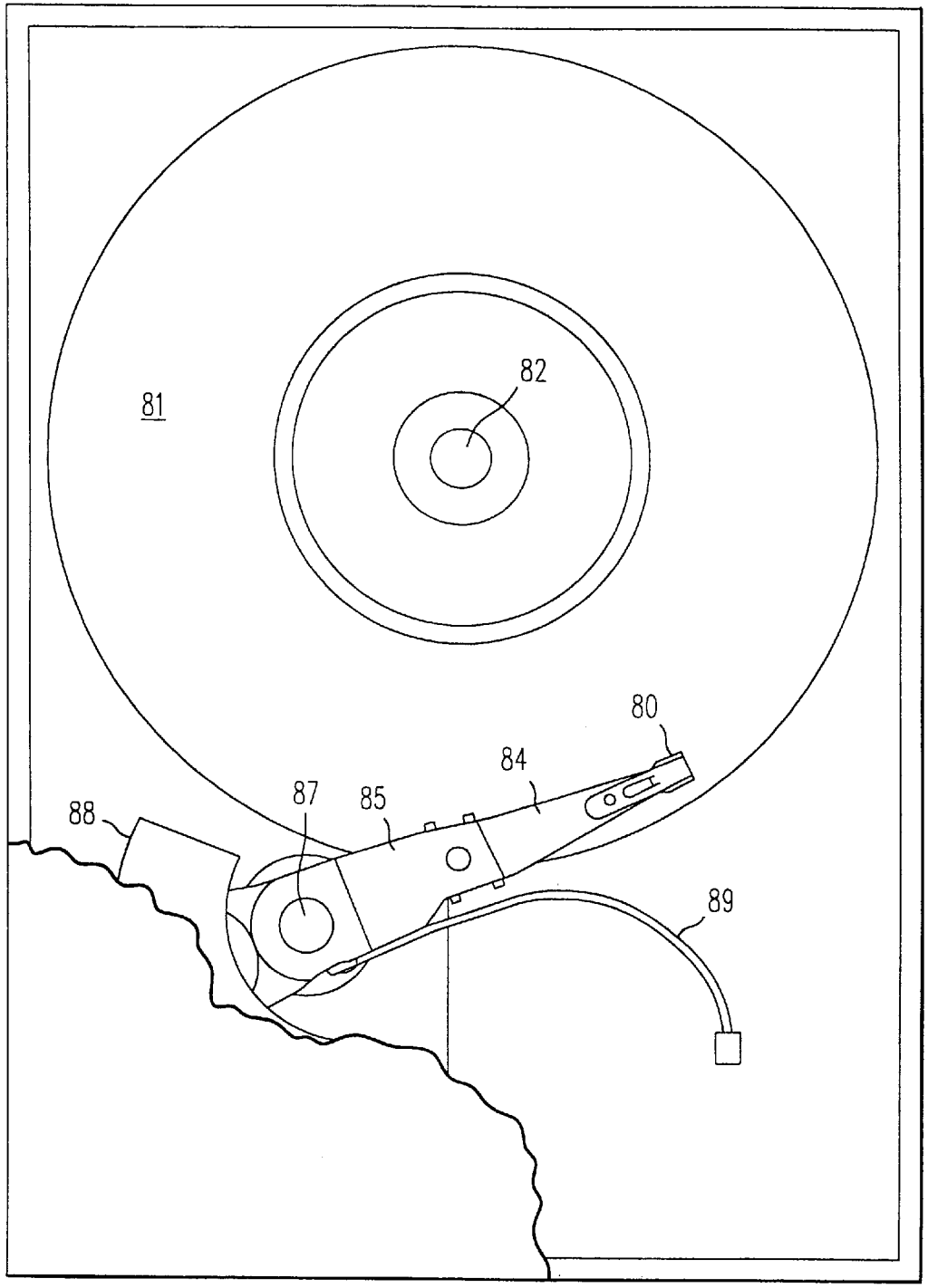
FIG. 8 is an illustration of a magnetic disk drive with the overlaid MR head of FIG. 7.

FIG. 8 illustrates a magnetic disk drive of the present invention with the overlaid MR head 80 of FIG. 7. The overlaid MR head active read area in FIG. 7 comprising the central region 60 is defined by the aligned edges 61 and 62 of the end regions 63 and 64 of the longitudinal bias layers. With the precise definition of the MR head active region, the MR head 80 of FIG. 8 may read data recorded on tracks on the surface of disk 81 that are narrow and spaced closely together, thereby providing a high data capacity. The MR head 80 reads the data recorded on disk 81 as the disk is rotated about a central axis 82 by a conventional spindle motor (not shown). The MR head 80 is mounted on a suspension assembly 84 and an actuator arm 85 so as to be moved from track to track by rotation of the actuator arm about a central axis 87 by an actuator motor 88. The data sensed by MR head 80 in the form of a change in voltage of the applied current across the sensor is supplied on line 89 to conventional drive electronics (not shown) for amplification and detection.

While the preferred embodiments of the present invention have been illustrated in detail, it should be apparent that modifications and adaptations to those embodiments may occur to one skilled in the art without departing from the scope of the present invention as set forth in the following claims.

I claim:

1. A method for fabricating a longitudinal bias layer and conductor leads at end regions of magnetoresistive sensor elements, said magnetoresistive sensor elements having an upper magnetoresistive sensor thin film layer, to form a sensor region between said end regions, comprising the steps of:

depositing a uniform longitudinal bias thin film layer overlaying the entirety of said upper magnetoresistive sensor thin film layer, said uniform layer having a thickness greater than a bias critical thickness, said bias critical thickness comprising the thickness required to maintain a longitudinal bias field, to stabilize said magnetoresistive sensor elements;

depositing a uniform conductor thin film layer overlaying the entirety of said longitudinal bias thin film layer;

conducting a photoresist process over said conductor thin film layer to develop a mask of said end regions and to expose a central region between said end regions;

conducting a reactive-ion-etching process to completely etch said conductor thin film layer in said exposed central region to expose said longitudinal bias layer in said central region between said end regions;

removing said photoresist mask; and conducting an ion milling process of at least said exposed longitudinal bias layer at said central region to a thickness thereof which is less than a null critical thickness, said null critical thickness comprising the thickness below which said longitudinal bias field is substantially zero, thereby forming a sensor region of said magnetoresistive sensor elements at said exposed longitudinal bias layer at said central region.

2. The method for fabricating a longitudinal bias layer and conductor leads of claim 1, wherein said deposited longitudinal bias layer serves as an etch stop for said reactive-ion-etch process.

3. The method for fabricating a longitudinal bias layer and conductor leads of claim 2, wherein said deposited longitudinal bias layer is comprised of Ni—Mn.

4. The method for fabricating a longitudinal bias layer and conductor leads of claim 3, wherein said bias critical thickness is substantially 25 nm and said null critical thickness is substantially 10 nm.

5. The method for fabricating a longitudinal bias layer and conductor leads of claim 3, comprising, subsequent to said depositing steps, the additional step of:

annealing said magnetoresistive elements and said deposited layers.

6. The method for fabricating a longitudinal bias layer and conductor leads of claim 3, wherein said deposited conductor layer comprises a layer of conductive Ta.

7. The method for fabricating a longitudinal bias layer and conductor leads of claim 1, comprising, subsequent to said depositing steps, the additional step of:

depositing a layer of $SiO_2$ overlaying the entirety of said conductor thin film layer, which $SiO_2$ layer is masked and exposed in said photoresist developing process and is completely etched in said exposed central region in said reactive-ion-etching process, and is milled in said end regions in said ion milling process, protecting said uniform conductor thin film layer in said end regions.

8. The method for fabricating a longitudinal bias layer and conductor leads of claim 1, wherein said magnetoresistive sensor elements comprise anisotropic magnetoresistive sensor elements, and wherein said upper magnetoresistive sensor thin film layer is an anisotropic magnetoresistive sense layer.

9. The method for fabricating a longitudinal bias layer and conductor leads of claim 1, wherein said magnetoresistive sensor elements comprise giant magnetoresistive sensor elements, and wherein said upper magnetoresistive sensor thin film layer is a free giant magnetoresistive layer.

10. A method for fabricating a magnetoresistive thin film sensor on a substrate, comprising the steps of:

depositing at least one magnetoresistive sensor layer overlaying said substrate;

depositing a uniform longitudinal bias thin film layer overlaying the entirety of said at least one magnetoresistive sensor layer, said uniform layer having a thickness greater than a bias critical thickness, said bias critical thickness comprising the thickness required to maintain a longitudinal bias field, to stabilize said at least one magnetoresistive sensor layer;

depositing a uniform conductor thin film layer overlaying the entirety of said longitudinal bias thin film layer;

conducting a photoresist process over said conductor thin film layer to develop a mask of said end regions and to expose a central region between said end regions;

conducting a reactive-ion-etching process to completely etch said conductor thin film layer in said exposed central region to expose said longitudinal bias layer in said central region between said end regions;

removing said photoresist mask; and conducting an ion milling process of at least said exposed longitudinal bias layer at said central region to a thickness thereof which is less than a null critical thickness, said null critical thickness comprising the thickness below which said longitudinal bias field is substantially zero, thereby forming a sensor region of said at least one magnetoresistive sensor layer at said exposed longitudinal bias layer at said central region.

11. The method for fabricating a magnetoresistive thin film sensor of claim 10, wherein said deposited longitudinal bias layer serves as an etch stop for said reactive-ion-etch process.

12. The method for fabricating a magnetoresistive thin film sensor of claim 11, wherein said deposited longitudinal bias layer is comprised of Ni—Mn.

13. The method for fabricating a magnetoresistive thin film sensor of claim 12, wherein said bias critical thickness is substantially 25 nm and said null critical thickness is substantially 10 nm.

14. A method for fabricating an anisotropic magnetoresistive thin film sensor on a substrate, comprising the steps of:

depositing at least one bias layer on said substrate for providing a transverse bias;

depositing at least one magnetoresistive sensor layer overlaying said bias layer;

depositing a uniform longitudinal bias thin film layer overlaying the entirety of said at least one magnetoresistive sensor layer, said uniform layer having a thickness greater than a bias critical thickness, said bias critical thickness comprising the thickness required to maintain a longitudinal bias field, to stabilize said at least one magnetoresistive sensor layer;

depositing a uniform conductor thin film layer overlaying the entirety of said longitudinal bias thin film layer;

conducting a photoresist process over said conductor thin film layer to develop a mask of said end regions and to expose a central region between said end regions;

conducting a reactive-ion-etching process to completely etch said conductor thin film layer in said exposed central region to expose said longitudinal bias layer in said central region between said end regions;

removing said photoresist mask; and conducting an ion milling process of at least said exposed longitudinal bias layer at said central region to a thickness thereof which is less than a null critical thickness, said null critical thickness comprising the thickness below which said longitudinal bias field is substantially zero, thereby forming a sensor region of said at least one magnetoresistive sensor layer at said exposed longitudinal bias layer at said central region.

15. The method for fabricating an ansisotropic magnetoresistive thin film sensor of claim 14, wherein said deposited longitudinal bias layer serves as an etch stop for said reactive-ion-etch process.

16. The method for fabricating an anisotropic magnetoresistive thin film sensor of claim 15, wherein said deposited longitudinal bias layer is comprised of Ni—Mn.

17. The method for fabricating an anisotropic magnetoresistive thin film sensor of claim 16, wherein said bias critical thickness is substantially 25 nm and said null critical thickness is 10 nm.

18. The method for fabricating an anisotropic magnetoresistive thin film sensor of claim 16, comprising, subsequent to said depositing steps, the additional step of:

annealing said deposited layers.

19. The method for fabricating an anisotropic magnetoresistive thin film sensor of claim 16, wherein said deposited conductor layer comprises a layer of conductive Ta.

20. The method for fabricating an anisotropic magnetoresistive thin film sensor of claim 14, comprising, subsequent to said depositing steps, the additional step of:

depositing a layer of $SiO_2$ overlaying the entirety of said conductor thin film layer, which $SiO_2$ layer is masked and exposed in said photoresist developing process and is completely etched in said exposed central region in said reactive-ion-etching process, and is milled in said end regions in said ion milling process, protecting said uniform conductor thin film layer in said end regions.

21. The method for fabricating an anisotropic magnetoresistive thin film sensor of claim 14, wherein said step of depositing at least one bias layer comprises the steps of:

depositing a soft adjacent layer on said substrate; and depositing a spacer layer overlaying said soft adjacent layer.

22. The method for fabricating an anisotropic magnetoresistive thin film sensor of claim 21, comprising the additional first step of depositing a pinning layer on said substrate, and said step of depositing a soft adjacent layer comprises depositing said soft adjacent layer on said pinning layer.

23. A method for fabricating a giant magnetoresistive thin film sensor on a substrate, comprising the steps of:

depositing at least one pinning layer on said substrate for providing a magnetic pinning;

depositing giant magnetoresistive sensor layers overlaying said pinning layer;

depositing a uniform longitudinal bias thin film layer overlaying the entirety of said giant magnetoresistive sensor layers, said uniform layer having a thickness greater than a bias critical thickness, said bias critical thickness comprising the thickness required to maintain a longitudinal bias field, to stabilize said giant magnetoresistive sensor layers;

depositing a uniform conductor thin film layer overlaying the entirety of said longitudinal bias thin film layer;

conducting a photoresist process over said conductor thin film layer to develop a mask of said end regions and to expose a central region between said end regions;

conducting a reactive-ion-etching process to completely etch said conductor thin film layer in said exposed central region to expose said longitudinal bias layer in said central region between said end regions;

removing said photoresist mask; and conducting an ion milling process of at least said exposed longitudinal bias layer at said central region to a thickness thereof which is less than a null critical thickness, said null critical thickness comprising the thickness below which said longitudinal bias field is substantially zero, thereby forming a sensor region of said underlying giant magnetoresistive sensor layers at said exposed longitudinal bias layer at said central region.

24. The method for fabricating a giant magnetoresistive thin film sensor of claim 23, wherein said deposited longitudinal bias layer serves as an etch stop for said reactive-ion-etch process.

25. The method for fabricating a giant magnetoresistive thin film sensor of claim 24, wherein said deposited longitudinal bias layer is comprised of Ni—Mn.

26. The method for fabricating a giant magnetoresistive thin film sensor of claim 25, wherein said bias critical thickness is substantially 25 nm and said null critical thickness is substantially 10 nm.

27. The method for fabricating a giant magnetoresistive thin film sensor of claim 25, comprising, subsequent to said depositing steps, the additional step of:

annealing said deposited layers.

28. The method for fabricating a giant magnetoresistive thin film sensor of claim 25, wherein said deposited conductor layer comprises a layer of conductive Ta.

29. The method for fabricating a giant magnetoresistive thin film sensor of claim 23, comprising, subsequent to said, the additional step of:

conducting a low temperature annealing step to thermally set said pinning layer and at least one of said giant magnetoresistive layers to provide said magnetic pinning.

30. The method for fabricating a giant magnetoresistive thin film sensor of claim 23, wherein said step of depositing giant magnetoresistive sensor layers comprises the steps of:

depositing a first giant magnetoresistive ferromagnetic layer on said pinning layer;

depositing a giant magnetoresistive spacer layer overlaying said first giant magnetoresistive ferromagnetic layer; and depositing a second giant magnetoresistive ferromagnetic layer overlaying said giant magnetoresistive spacer layer.

* * * * *